(12) United States Patent
Chlumsky et al.

(10) Patent No.: US 8,023,273 B2
(45) Date of Patent: Sep. 20, 2011

(54) ELECTRIC DEVICE HAVING A PLASTIC PLUG PART ARRANGED ON A CIRCUIT SUPPORT

(75) Inventors: Lubomir Chlumsky, Vienna (AT); Leopold Hellinger, Ziersdorf (AT); Anton Kocevar, St Pöiten (AT); Gerhard Neumann, St. Margarethen (AT)

(73) Assignee: Melecs EWS GmbH & Co KG, Osterreich (AT)

( * ) Notice: Subject to any disclaimer, the term of this patent is extended or adjusted under 35 U.S.C. 154(b) by 384 days.

(21) Appl. No.: 12/224,634

(22) PCT Filed: Jan. 10, 2007

(86) PCT No.: PCT/EP2007/050207
§ 371 (c)(1),
(2), (4) Date: Sep. 2, 2008

(87) PCT Pub. No.: WO2007/098972
PCT Pub. Date: Sep. 7, 2007

(65) Prior Publication Data
US 2009/0180265 A1    Jul. 16, 2009

(30) Foreign Application Priority Data

Mar. 2, 2006   (AT) .................................... 355/2006

(51) Int. Cl.
*H05K 5/02*    (2006.01)
(52) U.S. Cl. .................... 361/752; 361/730; 174/50.52; 174/520; 439/76.2

(58) Field of Classification Search ................. 361/730, 361/736, 752, 807; 174/50.52, 50.53; 439/76.1, 439/76.2
See application file for complete search history.

(56) References Cited

U.S. PATENT DOCUMENTS

| | | | |
|---|---|---|---|
| 5,231,561 A | 7/1993 | Johnson et al. | |
| 6,034,876 A * | 3/2000 | Ohno et al. | 361/752 |
| 6,042,392 A * | 3/2000 | Tsuji | 439/76.1 |
| 6,628,523 B2 * | 9/2003 | Kobayashi et al. | 361/736 |
| 6,707,678 B2 * | 3/2004 | Kobayashi et al. | 361/752 |
| 6,717,051 B2 * | 4/2004 | Kobayashi et al. | 174/535 |
| 6,927,337 B2 * | 8/2005 | Kobayashi et al. | 174/535 |
| 7,616,448 B2 * | 11/2009 | Degenkolb et al. | 361/752 |

FOREIGN PATENT DOCUMENTS

| | | |
|---|---|---|
| EP | 250 097 A1 | 12/1987 |
| JP | 2004303504 A | 10/2004 |

* cited by examiner

*Primary Examiner* — Dameon Levi

(57) ABSTRACT

Disclosed is an electrical device, in particular a control unit for a motor vehicle, comprising a plate-shaped circuit support fixed on a metallic base plate of the housing, on which a plastic plug part s fixed on a side facing away from the metallic base plate, characterized in that fixing means which are pivot-shaped and protrude from the base plate, are provided for the common mounting of the plastic plug part, the circuit support and the metallic base plate of the housing, that said fixing means are guided through corresponding recesses in the circuit support and in the plastic plug part, that a deformation is produced at each inserted end and that each deformation is supported y a supporting part on said plastic plug part.

9 Claims, 4 Drawing Sheets

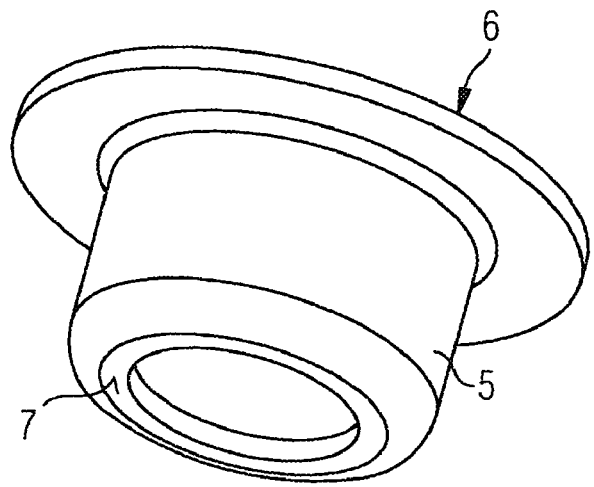
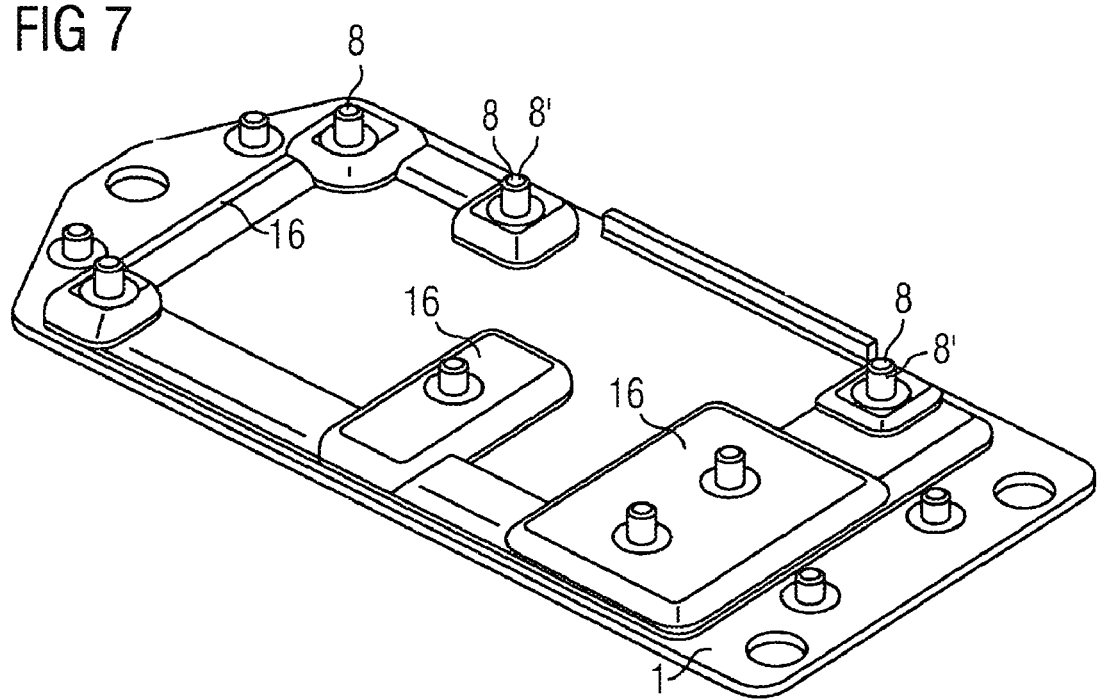

ELECTRIC DEVICE HAVING A PLASTIC PLUG PART ARRANGED ON A CIRCUIT SUPPORT

CROSS REFERENCE TO RELATED APPLICATIONS

This application is the U.S National Stage of International Application No. PCT/EP2007/050207 filed Jan. 10, 2007 and claims the benefit thereof. The International Application claims the benefits of Austrian application No. 355/2006 filed Mar. 2, 2006, both of the applications are incorporated by reference herein in their entirety.

FIELD OF INVENTION

The invention relates to an electric device, in particular a control device for a motor vehicle, having a plate-shaped circuit support that is fastened to a metallic housing baseplate and on which on a side facing away from the housing baseplate is arranged a plastic plug part.

BACKGROUND OF THE INVENTION

Electric devices employed in motor-vehicle engineering for example for controlling a gear consist mostly of a plate-shaped circuit support accommodated in a housing and fastened to a housing baseplate. A cable is connected via a plastic plug part led through a duct in the housing. The plastic plug part's electric contacts are connected to printed conductors on the circuit support.

Electric devices employed in a motor vehicle are exposed to harsh ambient conditions. High acceleration forces can occur during operation. Connected cables therein transmit vibrations to the solder connections inside the housing via the plug part. Even slight alternating stresses on said solder connections can severely affect the electronic device's reliability. It is consequently endeavored to keep the mechanical stresses introduced by a connecting cable as far away as possible from electric connections, solder connections, and pc-board plug-in connections, meaning that the mechanical connection between the plastic plug part, circuit support, and housing baseplate has to be implemented as being as structurally stable as possible.

Rivet joints are an economical implementation for a stable connection. However, the problem therein arises that if the plastic plug part is arranged on a side of the circuit support facing away from the housing baseplate then the plastic plug part will not be able to take up the mechanical forces necessary for producing the rivet joint without being damaged. Cracks which after the motor vehicle has been in use for a certain length of time can cause breaking in the plastic plug part. The electric connection between the connecting cable and printed conductors on the circuit support will as a further consequence be adversely affected. Inadequate fastening of the plastic plug part can thus cause the entire electric device to fail.

Separate fastening means, which is to say screws, for example, for fastening the plastic plug part to the circuit support and rivets, for instance, for the fastening between the circuit support and metallic housing baseplate, have hitherto been provided to prevent the plastic plug part from being damaged. That, though, is disadvantageous for large-scale production because different fastening means have to be kept ready and separate production steps are necessary.

SUMMARY OF INVENTION

The object of the invention is to provide an electric device in the case of which the mechanical fastening between a plastic plug part, a plate-shaped circuit support, and a metallic housing baseplate is as stable as possible, simple to implement, and economical to produce.

The object is achieved by means of an electric device having the features of the claims. Advantageous embodiments of the invention are the subject matter of dependent claims.

The invention proceeds from using a supporting part to take up the surface pressure occurring during a riveting operation so that a plug part made of plastic can also be riveted to a circuit support and metallic baseplate without being damaged.

The inventive electric device is hence characterized in that for the common fastening between the plastic plug part, circuit support, and metallic baseplate fastening means are provided that stand out from the baseplate like a tenon and are led through corresponding recesses in the circuit support and plastic plug part. Formed on the extremity of the end piece is a reshaped part that is supported by means of a supporting part on the plastic plug part. What is achieved thereby is that the surface pressure acting upon the plastic plug part while the rivet joint is being produced will be less. The plastic plug part will as a result be subjected to less strain while the mechanical connection is being produced. The plastic plug part will no longer be damaged. It will no longer be necessary for different fastening means to be kept ready during production. The separate procedural steps during the connection's production will therefore also be obviated. The production operation will as a result be simpler and can be performed by an automatic tool. The circuit support is during production placed together with the plastic plug part arranged thereon onto the housing baseplate by means of an automatic handling system in such a way that the fastening means standing out like a tenon project through corresponding recesses in the circuit support and plastic housing part. Each deformation section that is passed through is in a directly ensuing work operation deformed at its head side so that a stable fastening will be provided between the plastic plug part, circuit support, and housing baseplate. That results in a stable fastening able to cope also with a mechanical stress of the kind occurring while a motor vehicle is operating. The mechanical stress on the electric connection between the plastic plug part's individual contacts and the printed conductors on the circuit support will be less as a result. The reliability of the electric device will consequently be improved. Production costs will be reduced because the deformation sections that have been passed through are deformed in a single operation. That will be a decisive advantage during large-scale production.

It is in a preferred embodiment variant provided for each tenon-shaped fastening element to be embodied as a rivet peg produced as a single piece with the housing's baseplate. Each fastening means will hence be an integral constituent of the baseplate and can be produced jointly therewith in a single operation, for example through extrusion.

Preferred in particular is an embodiment variant in which the supporting part is embodied as a rivet sleeve having on its extremity a flange oriented radially outward and on an end facing the baseplate a flange oriented radially inward. The rivet spigot's closing head will as a result be encompassed around its external circumference by the sleeve. The bearing pressure occurring during riveting will be kept away from the plug part's less stressable plastic.

A preferred embodiment variant is characterized in that the rivet sleeve is held in a frictionally engaged manner in a bore hole in the plug part. That will make the rivet sleeve an unlosable constituent of the plug. The plug will be supplied to the electric-device manufacturer as a single article together with the rivet sleeve.

It is favorable for manufacturing purposes for the rivet pegs to be deformed at their extremity in a single work operation. If the closing head is formed on the rivet sleeve's flange oriented radially inward during deforming, then the rivet peg's height can be kept low if the rivet sleeve is embodied accordingly. That will be favorable when the rivet pegs are extruded.

An aluminum alloy is preferably used as the baseplate material. The rivet sleeve is made preferably from high-strength sheet steel through deep-drawing.

BRIEF DESCRIPTION OF THE DRAWINGS

For further elucidating the invention, reference is made in the following part of the description to the drawings showing further advantageous embodiments, specifics, and developments of the invention.

FIG. 6 shows the rivet sleeve in an enlarged, three-dimensional representation;

FIG. 7 shows the housing baseplate in a three-dimensional representation.

DETAILED DESCRIPTION OF INVENTION

Figure 1:
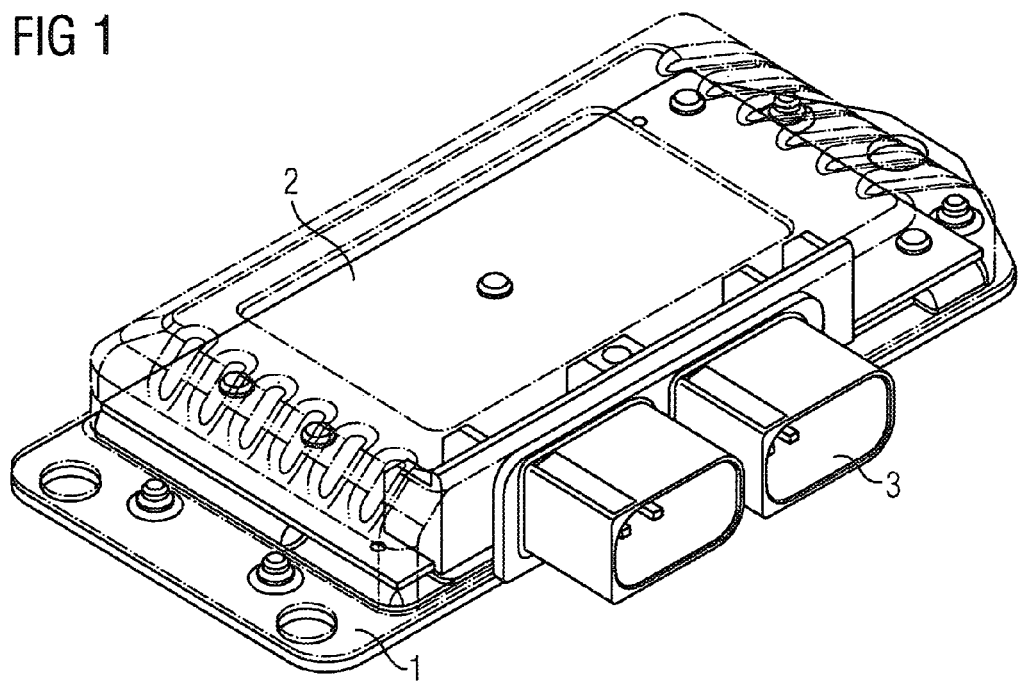
FIG. 1 shows a control device for a motor vehicle viewed onto the plastic plug part.
Figure 2:
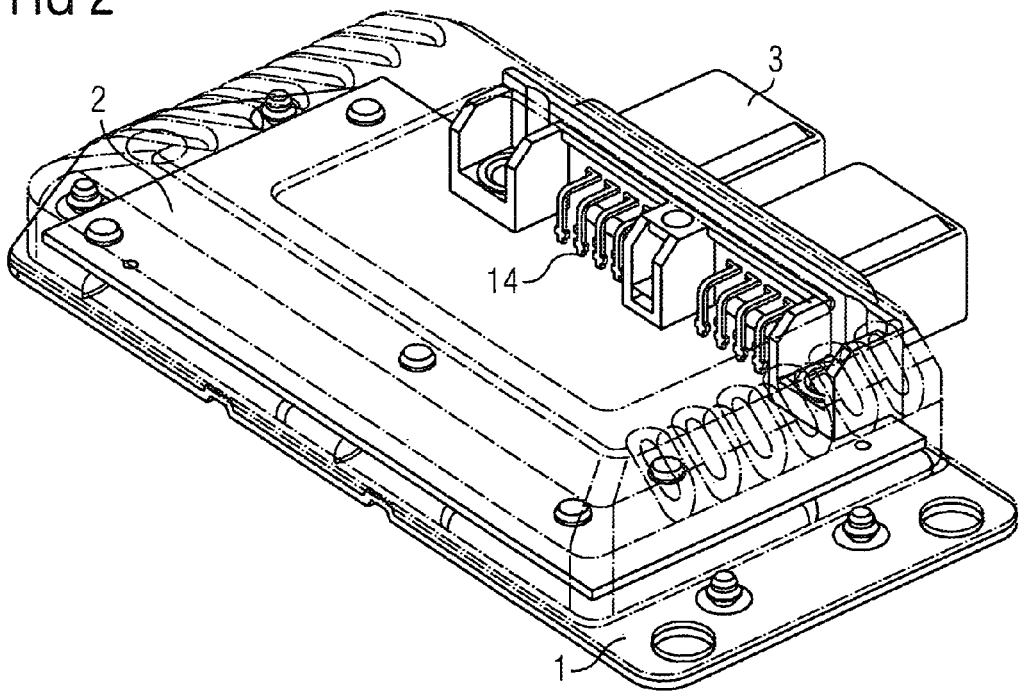
FIG. 2 shows the control device as shown in FIG. 1 viewed onto the plastic plug part's pc-board plug-in contacts.
Figure 3:
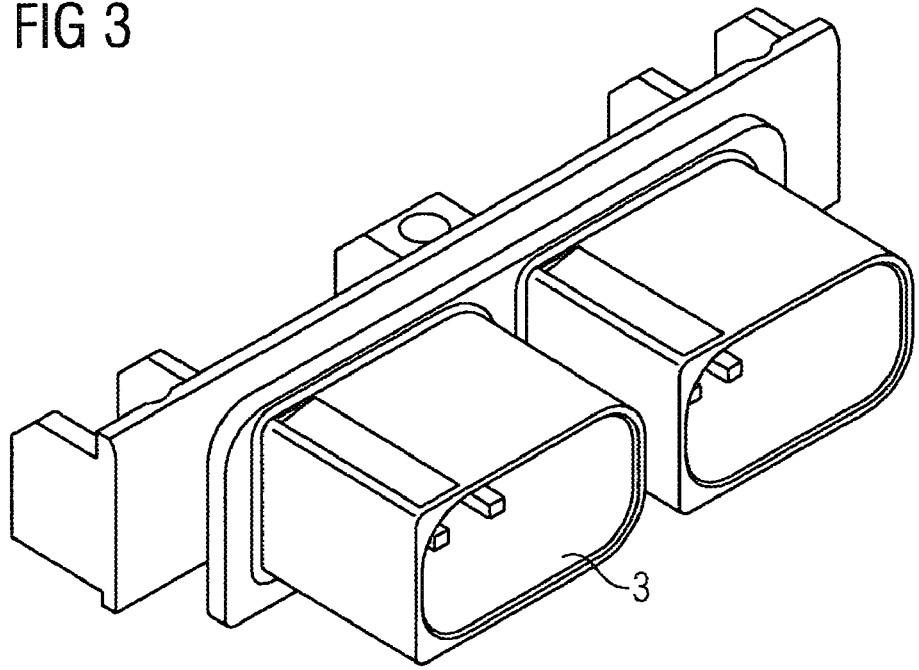
FIG. 3 shows the plastic plug part with a view onto the plug shaft's opening.
Figure 4:
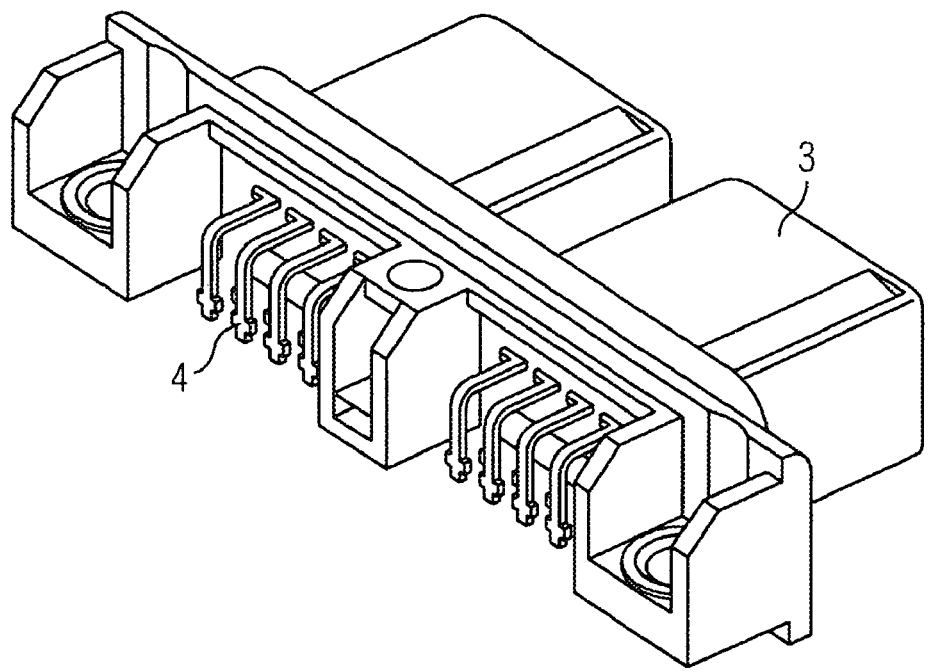
FIG. 4 shows the plastic plug part with a view onto the pc-board plug-in contacts.

FIGS. 1 and 2 show in each case as an exemplary embodiment of the invention a perspective view of a control device for a motor vehicle. Fastened onto a flat housing baseplate 1 is a circuit support 2 that can be seen through the transparently shown housing cover. Fastened onto the circuit support 2 is a plastic plug part 3 that is shown in FIG. 3 with a view onto the plug shaft. FIG. 4 shows the plastic plug part 3 with a view onto the pc-board plug-in contacts 4. The pc-board plug-in contacts 4 establish the electric connection to printed conductors 14 on the circuit support 2.

Figure 5A:
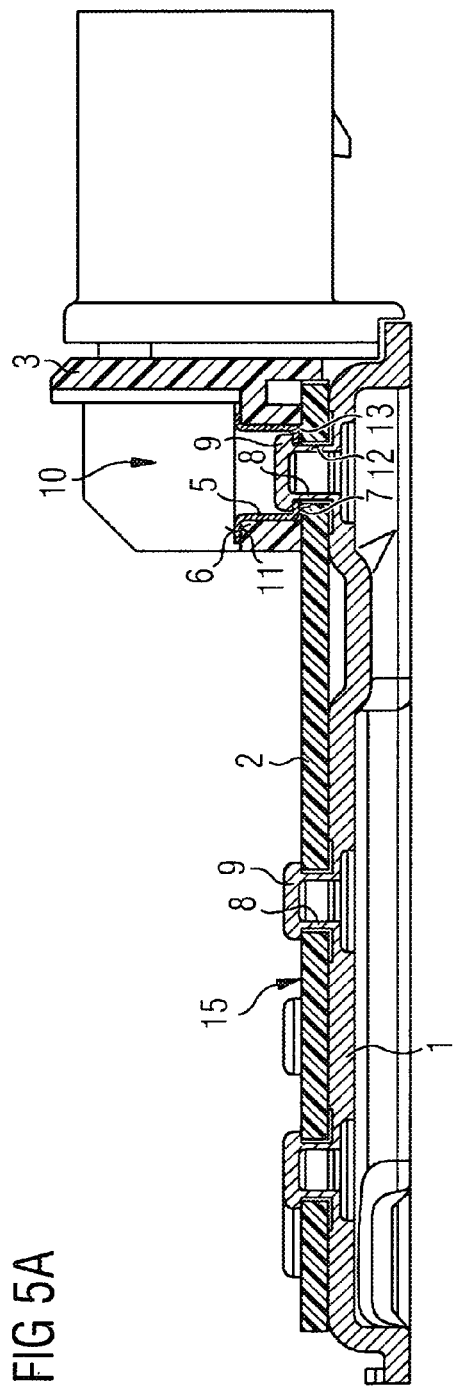
FIGS. 5a, b show the fastening between the plastic plug part, circuit support, and housing baseplate in an enlarged sectional representation.
Figure 5B:
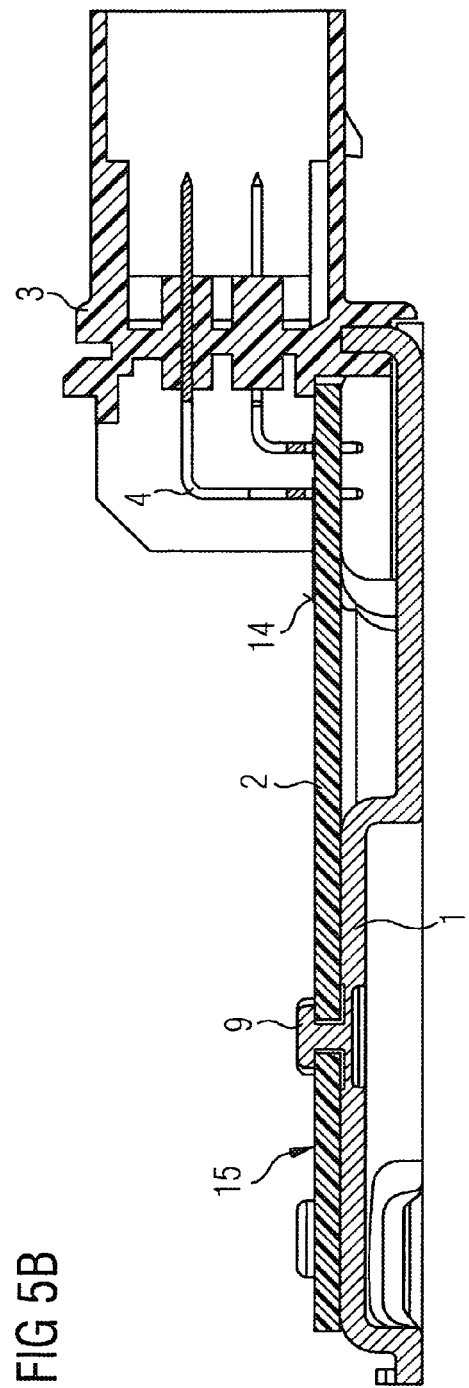

FIGS. 5a and 5b show in a sectional drawing by way of example the fastening between the plastic plug part 3, circuit support 2, and housing baseplate 1. Hollow cylindrical, thin-walled rivet pegs 8 have been formed on the housing baseplate 1 through extrusion. Said rivet pegs 8 form—as explained in more detail below—a mechanical connection between the plastic housing part 3, circuit support 2, and housing baseplate 1 or, as the case may be, between the circuit support 2 and housing baseplate 1. Each rivet peg 8 has for fastening the plastic plug part 3 been passed through a corresponding recess 12 in the circuit support 2 or, as the case may be, a recess 13 in the plastic plug part 3. As shown in the left-hand part of FIGS. 5a and 5b, the circuit support 2 is also fastened onto the baseplate 1 by means of rivet pegs 8 (only one rivet peg 8 has been drawn in FIGS. 5a and 5b). A clump-shaped thickening is in the assembled condition formed at each end of a rivet peg 8. Said thickening forms a closing head 9 of a rivet joint. The closing head 9 is formed in a single operation for all rivet pegs 8 when the control device is being produced. A hollow cylindrical supporting part 5 is inventively provided to prevent the plastic plug part 3 from being damaged while the closing head 9 is being produced. Said supporting part 5 (FIG. 6) consists of a rivet sleeve 5 produced from high-strength sheet steel through deep-drawing. The wall is 0.5 mm thick. The rivet sleeve 5 is held in a frictionally engaged manner in the recess 13 embodied as a bore hole. Said sleeve is hence unlosably joined to the plug part 3, meaning it is an integral constituent of the plastic plug part 3. The plastic plug part 3 is produced through injection molding. The rivet sleeve 5 can, though, also be at least partially extrusion coated with the polymeric material of the plug part 3. The rivet sleeve 5 will in that case be inserted into the injection-molding tool as an insert when the plastic plug part 3 is being produced. The rivet sleeve 5 is pot-shaped in cross-section with a hole in its base. It has a flange 6 oriented radially outward and a flange 7 oriented radially inward (FIG. 6). The flange 6 oriented radially outward is supported on a shoulder 11 formed in a cavity 10 of the plastic plug part 3. The closing head 9 is supported on the flange 7 oriented radially inward. Through the pot-shaped embodiment it is possible for the deformation section on the extremity of each rivet peg 8 to face the housing baseplate 1, which favors production by means of cold extrusion because the height of the rivet peg 8 can be kept low. Said rivet sleeve 5 acts as a rigid intermediate press-on part while the rivet joint is being produced. It insures that neither the deforming forces being applied nor the bearing pressure occurring while the closing head 9 is being formed can damage the plastic plug part 3 during the rivet joint's production. If vibrations are transmitted from the connecting cable to the plastic plug part while the motor vehicle is operating, then said mechanical connection will insure that the electric connection between the pc-board plug-in contacts 4 of the plug part 3 and the printed conductors 12 on the side 15 of the pc board 2 will not be adversely affected.

FIG. 7 is a perspective view of the housing baseplate 1 for the exemplary embodiment shown. Rivet pegs 8 standing out like a tenon can be seen on a side of the housing baseplate 1 adjacent in the assembled condition to the circuit support 2. Said rivet pegs 8 are located in the region of corrugation-like protuberances 16. Said protuberances 16 serve to stiffen the housing baseplate 1. The plastic plug part 3 shown separately in FIG. 3 and FIG. 4 is fastened by means of two opposite rivet pegs identified in FIG. 7 by the reference numeral 8'. The housing baseplate 1 is made from an aluminum alloy. The rivet pegs 8 are higher than their diameter; the height is preferably about 1.5 to six times the diameter of a rivet peg 8. The rivet pegs have been produced in a single operation by extrusion together with the housing baseplate 1. The procedure while the control device is being produced is now for the circuit support 2 together with the plastic plug part 3 thereon that is held by the plugged-in pc-board plug-in contacts 4 to be placed over said rivet pegs 8 and centered by them. A closing head 9 is in a directly ensuing work step formed simultaneously on the extremities of all rivet pegs 8 by means of an automatic tool. That produces a secure mechanical connection between the plastic plug part 3 and plate-shaped circuit support 2 on the one hand and—depending on the number/arrangement of the rivet pegs 8—simultaneously a rivet joint between the circuit support 2 and housing baseplate 1. The plastic plug part 3 can thanks to the rivet sleeve 5 be riveted without sustaining damage. The rivet sleeve 5 enables the closing head 9 to be close to the housing baseplate 1. The height of the rivet pegs 8 can be kept low thereby, which is favorable for cold extrusion.

The electric connection between the contacts 4 of the plastic plug part 3 and the printed conductors 14 on the circuit support 2 will be less fault-prone because the plastic plug part will not be damaged while the rivet joint is being formed. The reliability of the electric device can as a result be maintained at a high level over a long period of use even if high acceleration forces act upon the electric device or, as the case may be, strong vibrations are transmitted to the plug 3 via the cable.

The invention claimed is;

1. An electric device, comprising:
    a plate-shaped circuit support fastened to a metallic housing baseplate;
    a plastic plug part arranged on the plate-shaped circuit support of a side facing away from the housing baseplate;
    a fastening device that stands out from the housing baseplate like a tenon, wherein the fastening device fastens the plastic plug part, circuit support, and housing baseplate; and
    a plurality of recesses in the circuit support and plastic plug part that the fastening device leads through, wherein
        a deformation is formed on each end that is passed through, and
        each deformation is supported via a supporting part on the plastic plug part, where the supporting part is a rivet sleeve having on an end facing away from the housing baseplate a flange oriented radiall outward and on an end facing the housing baseplate a flange oriented radically inward, and
    wherein the recess in the plastic plug part is formed by a bore hole formed in a cavity, in that the flange oriented radially outward is supported on a shoulder of the bore hole, and in that the rivet sleeve is via friction in the bore hole.

2. The electric device as claimed in claim 1, wherein the deformation on the extremity is embodied as a clump-shaped closing head supported on the flange oriented radially inward of the rivet sleeve.

3. The electric device as claimed in claim 2, wherein each closing head of each rivet peg of the housing baseplate is produced in a single work operation.

4. The electric device as claimed in claim 3, wherein each rivet peg has a height is greater than a diameter of the rivet peg.

5. The electric device as claimed in claim 4, wherein each rivet peg has a height about 1.5 times the diameter of a rivet peg.

6. The electric device as claimed in claim 5, wherein the housing baseplate has been produced as an extruded part from an aluminum alloy.

7. The electric device as claimed in claim 5, wherein the housing baseplate has been produced as an extruded part from an aluminum-magnesium alloy.

8. Electric devices as claimed in claim 6, wherein at least sections of the supporting part are embedded in polymeric material of the plastic plug part.

9. The electric device as claimed in claim 8, wherein the supporting part is made of a high-strength steel.

* * * * *